US009923054B2

(12) United States Patent
Jhaveri et al.

(10) Patent No.: US 9,923,054 B2
(45) Date of Patent: Mar. 20, 2018

(54) FIN STRUCTURE HAVING HARD MASK ETCH STOP LAYERS UNDERNEATH GATE SIDEWALL SPACERS

(71) Applicant: Intel Corporation, Santa Clara, CA (US)

(72) Inventors: Ritesh Jhaveri, Portland, OR (US); Bernard Sell, Portland, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 216 days.

(21) Appl. No.: 14/726,282

(22) Filed: May 29, 2015

(65) Prior Publication Data
US 2015/0287779 A1 Oct. 8, 2015

Related U.S. Application Data

(62) Division of application No. 13/997,161, filed as application No. PCT/US2011/068269 on Dec. 31, 2011, now Pat. No. 9,048,260.

(51) Int. Cl.
H01L 29/66 (2006.01)
H01L 29/06 (2006.01)
(Continued)

(52) U.S. Cl.
CPC .. *H01L 29/0638* (2013.01); *H01L 21/823431* (2013.01); *H01L 21/823821* (2013.01);
(Continued)

(58) Field of Classification Search
CPC ............. H01L 29/0638; H01L 29/0649; H01L 29/66795; H01L 29/785; H01L 21/823431; H01L 21/823821; H01L 21/823864
(Continued)

(56) References Cited

U.S. PATENT DOCUMENTS 6,885,055 B2  4/2005  Lee
8,466,034 B2  6/2013  Maszara et al.
(Continued)

FOREIGN PATENT DOCUMENTS

CN   101292346 A   10/2008
CN   101355102 A   1/2009
(Continued)

OTHER PUBLICATIONS

First Office Action from the Chinese Patent Office dated Feb. 19, 2016 for Chinese Patent Application No. 201180075954.3.
(Continued)

*Primary Examiner* — Marc Armand
*Assistant Examiner* — Younes Boulghassoul
(74) *Attorney, Agent, or Firm* — Schwabe, Williamson & Wyatt, P.C.

(57) ABSTRACT

A hard mask etch stop is formed on the top surface of tall fins to preserve the fin height and protect the top surface of the fin from damage during etching steps of the transistor fabrication process. In an embodiment, the hard mask etch stop is formed using a dual hard mask system, wherein a hard mask etch stop layer is formed over the surface of a substrate, and a second hard mask layer is used to pattern a fin with a hard mask etch stop layer on the top surface of the fin. The second hard mask layer is removed, while the hard mask etch stop layer remains to protect the top surface of the fin during subsequent fabrication steps.

8 Claims, 7 Drawing Sheets

(51) Int. Cl.
  *H01L 21/8234* (2006.01)
  *H01L 21/8238* (2006.01)
  *H01L 29/78* (2006.01)

(52) U.S. Cl.
  CPC .... *H01L 29/0649* (2013.01); *H01L 29/66795* (2013.01); *H01L 29/785* (2013.01)

(58) Field of Classification Search
  USPC .......... 257/288, E21.235, E21.249, E21.429, 257/E21.409, E29.255; 438/283, 270, 438/197, 259, 595
  See application file for complete search history.

(56) References Cited

U.S. PATENT DOCUMENTS

| | | |
|---|---|---|
| 2005/0121412 A1 | 6/2005 | Beintner et al. |
| 2005/0173759 A1 | 8/2005 | Kim |
| 2005/0199920 A1* | 9/2005 | Lee ................. H01L 29/7851 257/288 |
| 2005/0263795 A1* | 12/2005 | Choi ................ H01L 29/66795 257/213 |
| 2006/0088967 A1 | 4/2006 | Hsiao et al. |
| 2007/0004124 A1 | 1/2007 | Suk et al. |
| 2007/0026593 A1* | 2/2007 | Jawarani ............ H01L 29/1083 438/197 |
| 2007/0069293 A1 | 3/2007 | Kavalieros |
| 2007/0145498 A1* | 6/2007 | Metz ................. H01L 29/0847 257/410 |
| 2007/0241414 A1 | 10/2007 | Narihiro |
| 2008/0217694 A1* | 9/2008 | Anderson ......... H01L 29/66795 257/365 |
| 2008/0315309 A1 | 12/2008 | Chang et al. |
| 2009/0017584 A1* | 1/2009 | Cheng ............... H01L 29/66795 438/157 |
| 2009/0026553 A1 | 1/2009 | Bhuwalka |
| 2010/0295021 A1 | 11/2010 | Chang et al. |
| 2011/0042744 A1* | 2/2011 | Cheng ............... H01L 29/66795 257/347 |
| 2011/0049613 A1 | 3/2011 | Yeh |
| 2012/0138886 A1* | 6/2012 | Kuhn .................... B82Y 10/00 257/9 |
| 2013/0049140 A1* | 2/2013 | Asenov ................ H01L 29/517 257/411 |

FOREIGN PATENT DOCUMENTS

| | | |
|---|---|---|
| CN | 102208349 A | 10/2011 |
| TW | 200729407 A | 9/1995 |
| TW | 201110352 A | 3/2011 |
| WO | WO 2007/038575 A2 | 4/2007 |

OTHER PUBLICATIONS

International Search Report dated Sep. 21, 2012 for PCT/US2011/068269, filed Dec. 31, 2011, 3 pages.
Notice of Allowance and Search Report (6 pages) from the State Intellectual Property Office (SIPO) dated Jul. 12, 2016 for Chinese Patent Application No. 201180075954.3 and English Translation (1 page) there of.

* cited by examiner

FIN STRUCTURE HAVING HARD MASK ETCH STOP LAYERS UNDERNEATH GATE SIDEWALL SPACERS

This is a Divisional of application Ser. No. 13/997,161 filed Jun. 21, 2013, which is a U.S. National Phase application under 35 U.S.C. § 371 of International Application No. PCT/US2011/068269, filed Dec. 31, 2011.

FIELD OF THE INVENTION

Embodiments of this invention relate to the field of semiconductor devices and more particularly to methods for forming fin-based transistor structures using a hard mask etch stop to preserve fin height during the fabrication process.

BACKGROUND

Advances in semiconductor manufacturing technology have led to the integration of billions of circuit elements, such as transistors, on a single integrated circuit (IC). In order to integrate increasing numbers of circuit elements onto an integrated circuit, it has been necessary to reduce the dimensions of the transistors. Non-planar, fin-based MOS-FETs have enabled increased performance for a smaller device footprint. Wrap-around gates due to higher control of short channel effects such as parasitic capacitance and off-state leakage. Taller fins enable greater drive current, but fin height can be reduced by damage incurred to the top surface of the fin during the fabrication process due to etching of other device components.

DETAILED DESCRIPTION

A method for forming a fin-based transistor having tall fins is described. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Embodiments of the present invention provide methods for forming a fin-based transistor having tall fins, where the top of the tall fin is protected by a hard mask etch stop during etching of other device components. In one embodiment, a dual hard mask is formed over the surface of a semiconductor substrate. The top, second hard mask is used to define a tall fin on the substrate surface. The second hard mask is removed after formation of the fin, and the lower, first hard mask layer is retained to protect the top surface of the fin during subsequent fabrication processes. For example, during the etching of material to form a gate structure for a replacement gate process, the first hard mask layer prevents recessing of the top surface of the fin. In addition, the first hard mask layer may protect the top surface of the fin during removal of protective sidewall spacers from the sidewalls of the fin. Thus, the first hard mask layer preserves the tall height of the fin and the pristine nature of the top surface. The first hard mask layer is removed from the channel region in order to form a functional gate structure in contact with the fin surface. The first hard mask may also be removed from the source and drain regions of the fin in order to form source and drain contacts.

In another embodiment, a hard mask etch stop structure is self-aligned on the top surface of the fin by forming a dielectric material over the fin, polishing the dielectric material to be planar with the top surface of the fin, selectively recessing the fin to form a trench, and forming the hard mask etch stop structure within the trench. The hard mask etch stop structure may comprise a single hard mask material, or it may comprise a hard mask layer lining the bottom and side surfaces of the trench, and a sacrificial fill material formed over the hard mask layer. The hard mask etch stop structure covers the top surface of the fin, protecting it and preserving fin height during subsequent etching steps of the fabrication process. The hard mask etch stop structure may be removed from the channel region of the fin during formation of the gate, and from the source and drain regions of the fin during formation of source and drain contacts.

Figure 1A:
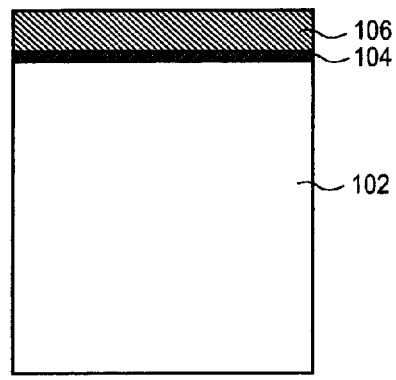
FIGS. 1A-H illustrate a two-dimensional cross-sectional view of steps in a process for forming a fin-based semiconductor device structure, in accordance with an embodiment of the invention
Figure 1B:
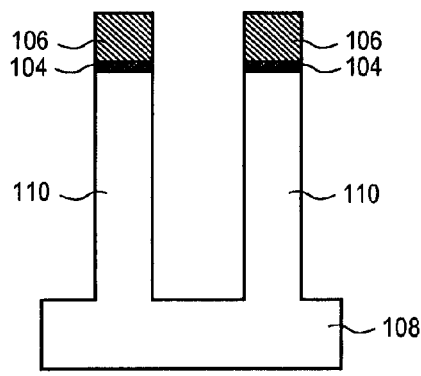
Figure 1C:
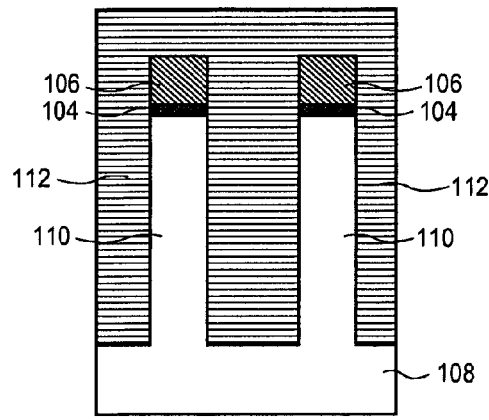
Figure 1D:
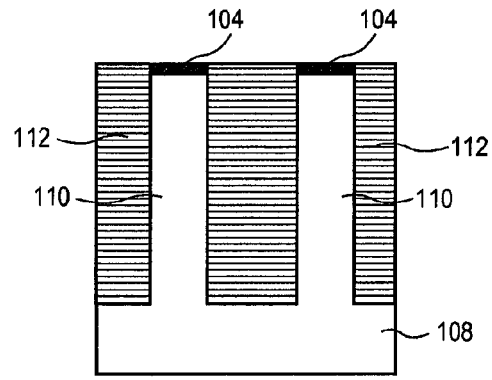
Figure 1E:
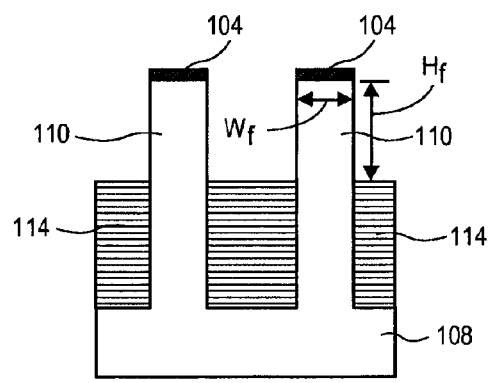
Figure 1F:
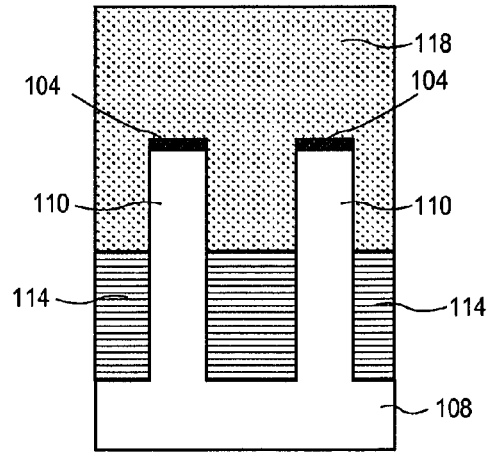
Figure 1G:
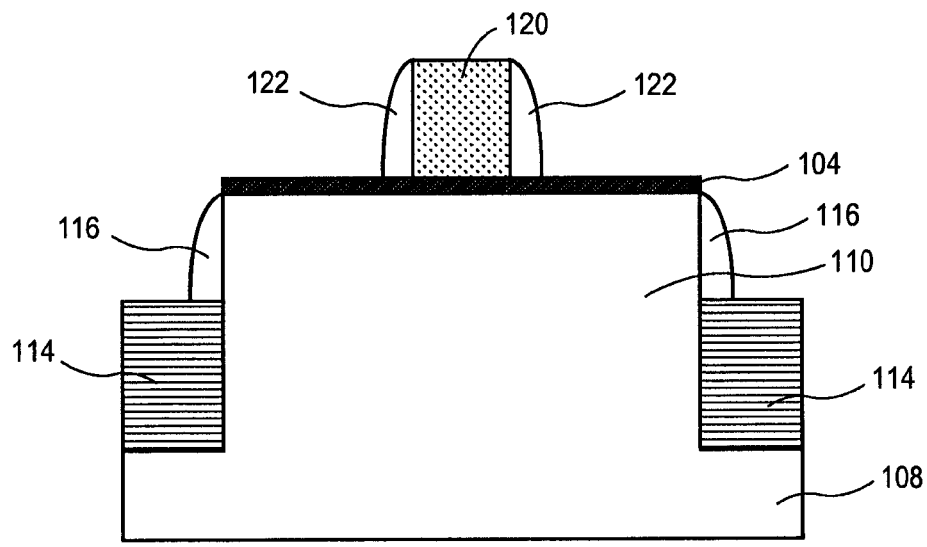
Figure 1H:
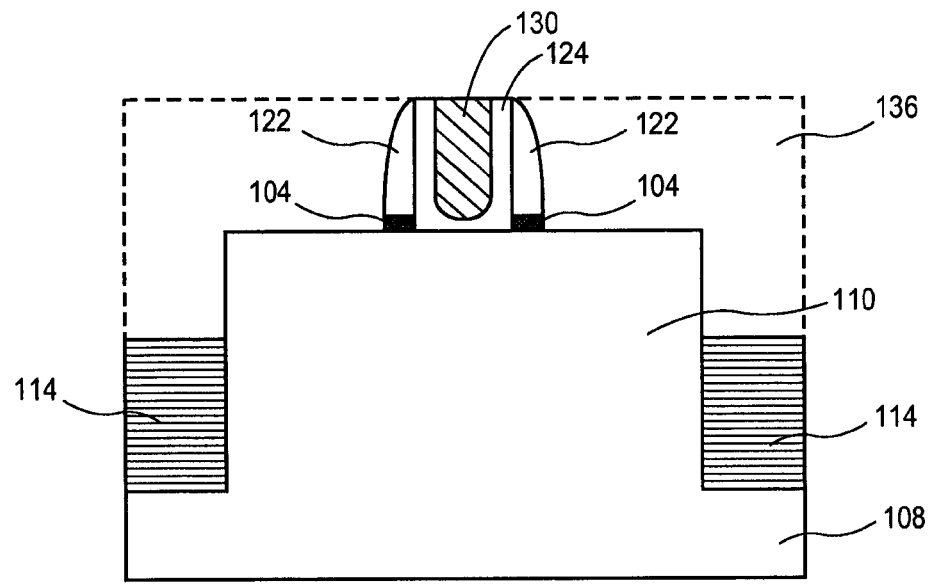

FIGS. 1A-1H illustrate a two dimensional view of steps in a process for forming a fin-based transistor having very tall fins. FIGS. 1A-1F illustrate a view along the length of the fins, while FIGS. 1G-1H illustrate a view perpendicular to the length of the fins and parallel to the gate structure. Though two fins are illustrated by way of example, it is to be understood that more or fewer fins may be formed.

A substrate 102 is provided, as shown in FIG. 1A. Substrate 102 can be formed of any well known material that can be reversely altered from an insulating state to a conductive state by applying external electrical controls. In an embodiment, substrate 102 is a bulk monocrystalline substrate. Substrate 102 may be any well known semiconductor material, such as, but not limited to, silicon, germanium, silicon germanium, and III-V combinations including GaAs, InSb, GaP, and GaSb. In another embodiment, substrate 102 is a semiconductor-on-insulator (SOI) substrate comprising a bulk lower substrate, a middle insulation layer, and a top monocrystalline layer. The top monocrystalline layer may comprise any material listed above for the bulk monocrystalline substrate.

A first hard mask layer 104 is blanket deposited over the substrate surface. In an embodiment, first hard mask layer 104 is a material resistant to the etch process used to etch the subsequently formed dummy gate electrode material. In an embodiment, first hard mask material 104 is silicon dioxide or a high k metal oxide dielectric, such as titanium oxide, hafnium oxide, or aluminum oxide. First hard mask material may be 1 to 10 nm thick. In an embodiment, first hard mask 104 is 3 nm thick. First hard mask layer 104 may be formed by any suitable process, such as chemical vapor deposition (CVD), physical vapor deposition (PVD) or atomic layer deposition (ALD).

A second hard mask layer 106 is blanket deposited over first hard mask layer 104. Second hard mask layer 106 may be any material resistant to the etch process used to etch substrate 102 material to form fins 110. In an embodiment, second hard mask layer 106 is a material that has different etch properties than first hard mask layer 104. In an embodiment, second hard mask layer 106 is silicon nitride. Second hard mask layer 106 may be 10 to 100 nm thick. In an embodiment, second hard mask layer 106 is 50 nm thick. Second hard mask layer may be formed by any suitable process, such as CVD, PVD, or ALD.

In an embodiment, second hard mask layer 106 is then patterned as illustrated in FIG. 1B to form a mask defining a plurality of high aspect ratio lines on the surface of substrate 102. Second hard mask layer 106 may be patterned using photolithography, as is well known in the art. In an embodiment, first hard mask layer 104 is patterned in alignment with second hard mask layer 106.

Next, substrate 102 is etched in alignment with the mask to form a plurality of fins 110 on base substrate 108, as shown in the embodiment illustrated by FIG. 1B. In an embodiment where substrate 102 is an SOI substrate, fins 110 are formed from the top monocrystalline layer. Substrate 102 may be etched by any suitable process, such as a dry etch or wet etch.

In an embodiment, dielectric material 112 is blanket deposited over the fins, as shown in FIG. 1C. Dielectric material 112 completely fills the gaps between fins 110 and forms over the top surface of second hard mask 106 on fins 110. In an embodiment, Dielectric material 112 may be any material suitable to insulate adjacent devices and prevent leakage from the fins. In an embodiment, dielectric material 112 is silicon dioxide. Dielectric material 112 may be deposited by any suitable process, such as CVD, ALD and other methods.

In an embodiment, dielectric material 112 is polished to be planar with the surface of first hard mask layer 104, as shown in FIG. 1D. In an embodiment, second hard mask layer 106 is removed by the polishing process. A portion of first hard mask layer 104 may be removed in the polishing process. Dielectric material 112 and second hard mask layer 106 may be polished by any suitable process, such as chemical mechanical polishing (CMP).

Next, dielectric material 112 is recessed to expose a portion of the sidewalls of fins 110, as illustrated by FIG. 1E. In an embodiment, the recessed dielectric material 112 forms shallow trench isolation (STI) regions 114. In an embodiment, the exposed portion of fins 110 will be used to form the active portions of the transistor. The amount of fin 110 exposed above STI region 114 will determine the drive current, gate width, and other transistor characteristics. As such, the extent to which dielectric material 112 is recessed is determined by the desired fin height $H_f$ above the surface of STI regions 114, as shown in FIG. 1E. The base of each fin 110 is isolated from neighboring fins by STI regions 114, as shown in FIG. 1E. STI regions 114 may also prevent leakage and cross-talk between neighboring fins. In an embodiment, dielectric material 112 is recessed by an etching process selective to first hard mask layer 104.

In an embodiment, fins 110 have a high aspect ratio. The aspect ratio of fins 110 is defined as the ratio of the fin 110 height $H_f$ above the STI region to the fin width $W_f$, i.e. $H_f:W_f$. Fins 110 may have a height $H_f$ from 50-150 nm and a width $W_f$ from 5-15 nm thick. As such fins 110 may have an aspect ratio from about 5:1-20:1.

In an embodiment, a gate dielectric material is blanket deposited over the fins to a uniform thickness. In an embodiment, the gate dielectric material forms a sacrificial gate dielectric over the surface of each fin 110. In another embodiment, the gate dielectric material forms a functional gate dielectric layer over the surface of each fin 110. Gate dielectric material may be any well known gate dielectric material. In an embodiment, gate dielectric material is silicon dioxide, silicon oxynitride, silicon nitride, or a high k material such as, for example, tantalum pentaoxide, titanium oxide, and hafnium oxide. Gate dielectric material may be formed from 5-20 Å thick.

Gate material 118 is then blanket deposited over the gate dielectric material, as shown in FIG. 1F. Gate material 118 conforms to the sidewall surfaces of the fins and the top surface of first hard mask layer 104. In an embodiment, gate material 118 is deposited to a thickness greater than the height of first hard mask 104 on the top surface of fins 110. Gate material 118 may be any well known material that may act as a functional gate or sacrificial gate, such as, for example, silicon dioxide, silicon nitride, polysilicon, or a metal.

Next, as shown in FIG. 1G, gate material 118 is etched to define a gate structure 120, according to an embodiment of the invention. In an embodiment, gate structure 120 comprises gate dielectric layer and gate material 118. In an embodiment, gate structure 120 wraps around the sidewalls and top surface of each fin 110. Gate structure 120 has a pair of sidewalls that run in a direction perpendicular to the length of fins 110. Gate structure 120 defines a channel region underneath the gate structure, disposed in fin 110, and a source and drain region on opposite sides of the channel region.

In an embodiment, first hard mask layer 104 protects the top surface of fin 110 during the etching processes that define gate structure 120. Gate material 118 is etched by any process that is highly selective to first hard mask layer 104. Due to the very tall height of fins 110, the etching process will remove gate material 118 from above fins 110 before removing gate material 118 above the surface of STI regions 114. In an embodiment, the gate material 118 etch is highly selective to first hard mask 104 in order to prevent etching of the top surface of fins 110 while etching gate material 118 from above the surface of STI regions 114. In an embodiment, the etch process has a selectivity greater than 10:1 of gate material 118 to the material forming first hard mask 104. A portion of first hard mask layer 104 may be removed during the etching process of gate material 118.

Next, a conformal spacer material is blanket deposited over gate structure 120, first hard mask layer 104, and fins 110. In an embodiment, the conformal spacer material is etched from horizontal surfaces to form gate sidewall spacers 122 and fin sidewall spacers 116, as shown in FIG. 1G. In an embodiment, a protection layer may be formed over the gate prior to the spacer etch so as to help protect the gate sidewall spacers during the spacer overetch to remove the spacer material from the fin. In an embodiment, gate sidewall spacers 122 protect the channel region during optional doping of the source and drain regions of the fin. In another embodiment, gate sidewall spacers 122 isolate the gate from epitaxial material subsequently grown from the surface of the source and drain regions of fins 110. In an embodiment, the spacer etch also removes fin sidewall spacers 116 from the sidewalls of fin 110. Gate sidewall spacers 122 and fin sidewall spacers 116 may be etched by any process that is highly selective to first hard mask layer 104, so that first hard mask layer 104 protects the top surface of fin 110. The spacer material may be etched by any suitable process, such as dry anisotropic ion etching.

Next, in an embodiment, first hard mask layer 104 is removed from the top surface of fin 110 in the source and drain regions. In an embodiment, the top surface of fin 110 is pristine, due to the protection of first hard mask layer 104 during prior steps of the fabrication process. The pristine nature of the top surface of fin 110 facilitates growth of an optional high quality epitaxial semiconductor layer from the top surface of fins 110. The epitaxial semiconductor layer may also be grown from fin sidewalls.

In an embodiment of the invention, gate structure 120 is a functional gate electrode, forming a dual-gate device wherein each of the sidewalls of fins 110 form active regions of the transistor. In an embodiment, first hard mask layer 104 isolates the top surface of the fin from the gate structure, as shown in FIG. 1G.

In another embodiment, gate structure 120 is a sacrificial gate structure, wherein a functional gate structure will be formed by a replacement gate process, as shown in FIG. 1H. In such an embodiment, interlayer dielectric (ILD) material 134 is formed over the surface of the structure. ILD material 134 may be any material suitable to mitigate cross-talk between subsequently formed device layers. ILD material 134 may comprise low k materials such as, for example, carbon-doped oxide, porous dielectrics, fluorine-doped oxide, and the like. In addition, ILD material 134 may be used to form the next layer of devices. In an embodiment, ILD material 134 is polished to expose the top surface of gate structure 120.

Next, gate structure 120 is removed to expose first hard mask layer 104 on the top surface of fin 110 within the channel region. First hard mask layer 104 is then etched from the channel region to expose the top surface of fin 110. In an embodiment, gate dielectric layer 124 is blanket deposited to conform to the channel region as defined by gate spacers 122 and the top and sidewall surfaces of fin 110. Gate dielectric layer 124 may be any well known gate dielectric layer, such as, for example, silicon dioxide, silicon oxynitride, or silicon nitride.

Gate electrode 130 is then deposited over gate dielectric layer 124. Gate electrode 130 comprises any well known gate electrode material, such as, for example, polycrystalline silicon or a metal, including tungsten, tantalum, titanium, and their nitrides. In an embodiment, gate electrode 130 comprises a work function setting material and a non-work function setting material. Together, gate dielectric layer 124 and gate electrode 130 form a functional gate structure.

The transistor has a source region and a drain region formed in fin 110 on opposite sides of the gate structure. In an embodiment, contact openings are etched in ILD layer 134 to expose first hard mask layer 104 on the top surface of fin 110. First hard mask layer 104 is then etched to expose the top surface of fin 110. In an embodiment, a portion of first hard mask 104 remains on the top surface of fin 110 underneath the gate sidewall spacer 122, as shown in FIG. 1H.

In an embodiment, source and drain contacts are formed directly on the surface of fins 110. In another embodiment, source and drain contacts are formed over the epitaxial material grown on fins 110. In an embodiment, source and drain contacts comprise a metal species. Source and drain contacts may be deposited by CVD or PVD.

Thus, a fin-based transistor having very tall fins may be formed, wherein the height of the fin is preserved during steps in the fabrication process by a first hard mask layer formed on the top surface of the fin.

Figure 2A:
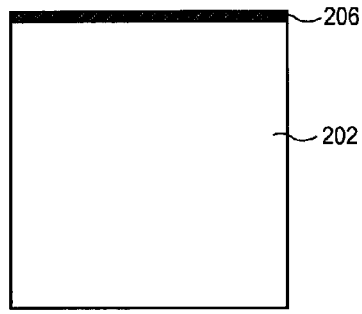
FIGS. 2A-K illustrate a two-dimensional cross-sectional view of steps in a process for forming a fin-based semiconductor device structure, in accordance with an embodiment of the invention.
Figure 2D:
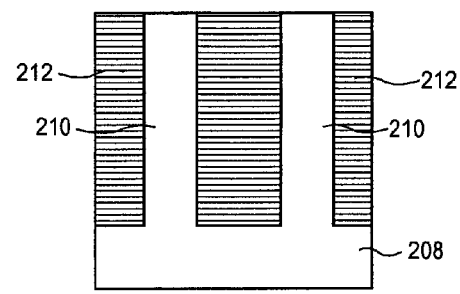
Figure 2B:
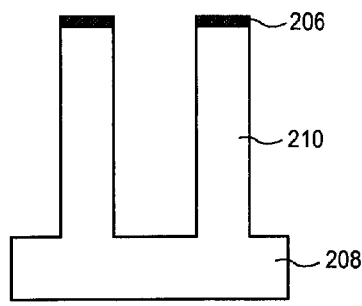
Figure 2E:
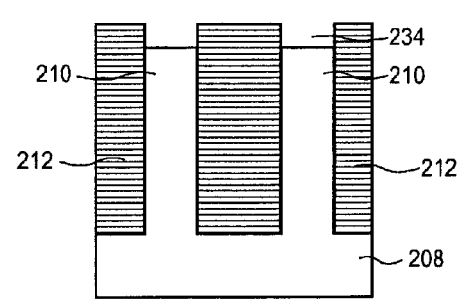
Figure 2C:
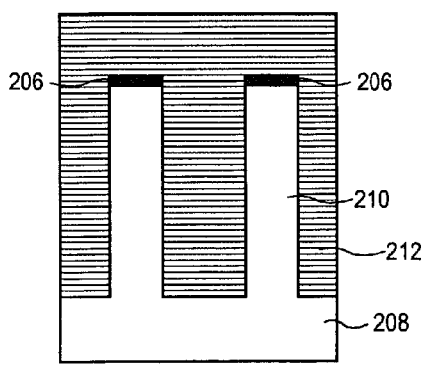
Figure 2F:
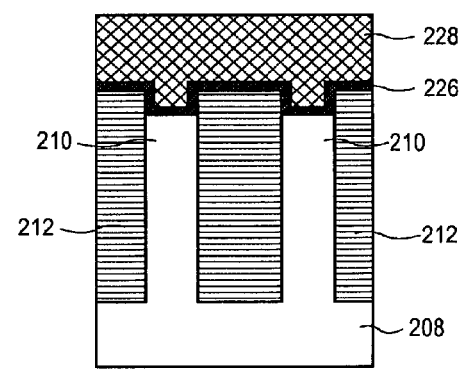
Figure 2G:
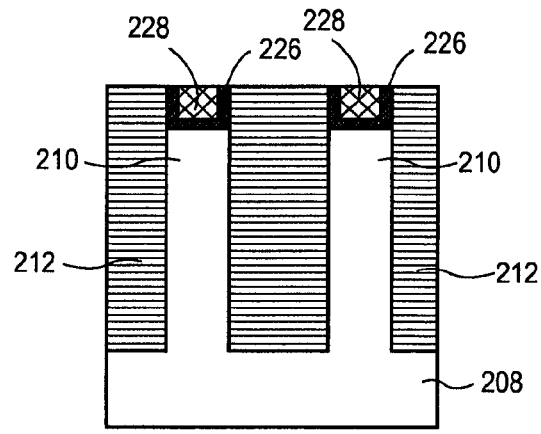
Figure 2H:
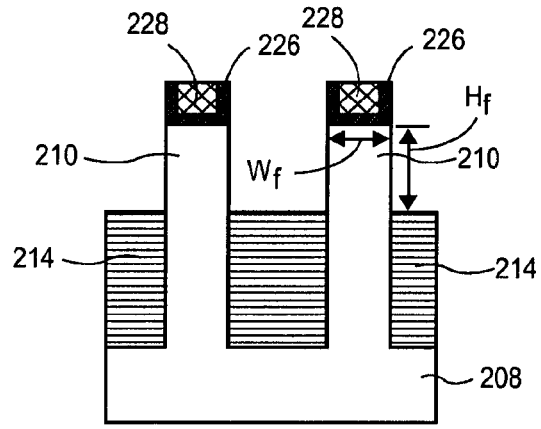
Figure 2I:
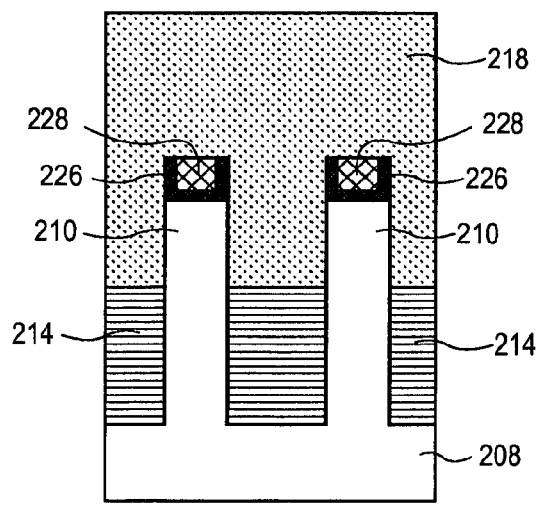
Figure 2J:
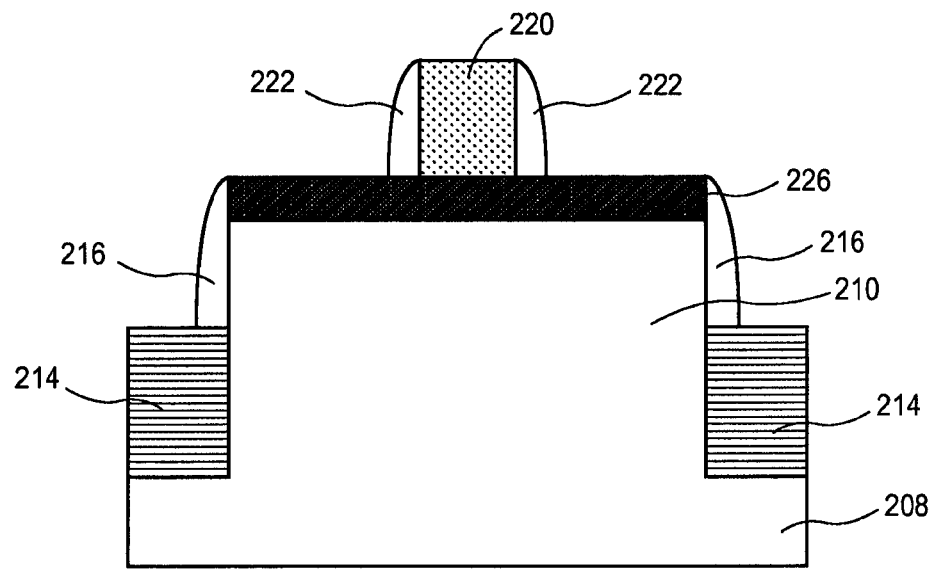
Figure 2K:
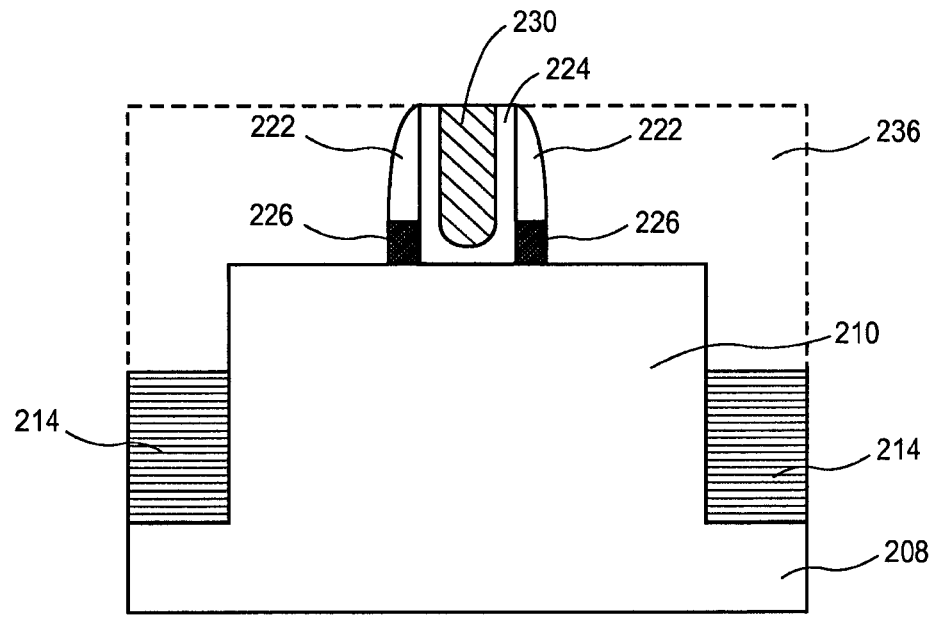

FIGS. 2A-2J illustrate a two dimensional view of steps in a process for forming a fin-based transistor having very tall fins. FIGS. 2A-2I illustrate a view along the length of the fins, while FIGS. 2J-2K illustrate a view perpendicular to the length of the fins and parallel to the gate structure. Though two fins are illustrated by way of example, it is to be understood that more or fewer fins may be formed.

A bulk substrate 202 is provided as shown in FIG. 2A. Bulk substrate 202 may have the same composition and characteristics of bulk substrate 102, described above with respect to FIG. 1A. A hard mask layer 206 is blanket deposited over the surface of the substrate, as shown in FIG. 2A. Hard mask layer 206 may have the same composition and characteristics of second hard mask layer 106, also described above with respect to FIG. 1A.

In an embodiment, hard mask layer 206 is then patterned to form a mask defining a plurality of high aspect ratio lines on the surface of substrate 202. Hard mask layer 206 may be patterned using photolithography, as is well known in the art. Next, substrate 202 is etched in alignment with the mask to form a plurality of fins 210 on base substrate 208, as shown in the embodiment illustrated by FIG. 2B. Substrate 202 may be etched by any suitable process, such as a dry etch or wet etch.

Next, dielectric material 212 is blanket deposited over the fins, as shown in FIG. 2C. In an embodiment, dielectric material 212 fills the gaps between fins 210 and covers the top surface of hard mask layer 206. In an embodiment, Dielectric material 212 may be any material suitable to insulate adjacent devices and prevent leakage from the fins. In an embodiment, dielectric material 212 is silicon dioxide. Dielectric material 212 may be deposited by any suitable process, such as CVD. In an embodiment, dielectric material 212 is polished to be planar with the top surface of fins 210, as shown in FIG. 2D. In an embodiment, hard mask layer 206 is removed by the polishing process. Dielectric material 212 and hard mask layer 206 may be polished by any suitable process, such as chemical mechanical polishing (CMP).

Next, a portion of fin 210 is recessed below the top surface of dielectric material 212 to form a trench 234. Fin 210 may be recessed about 5-10 nm below the surface of dielectric material 212. Fin 210 may be recessed by any process selective to dielectric material 212.

Next, a protective hard mask layer 226 is blanket deposited on the surfaces of dielectric material 212 and fin 210, conforming to trench 234. Protective hard mask layer 226 may be any suitable hard mask material, such as, for example, silicon dioxide, titanium oxide, hafnium oxide, aluminum oxide and other dielectric films. Protective hard mask layer 226 may be from 50 to 100 Å thick. Protective hard mask layer 226 may be deposited by any suitable process, such as CVD.

A sacrificial material 228 is then blanket deposited over protective hard mask layer 226, as shown in FIG. 2F. Sacrificial material 228 may be any material that planarizes well, such as, for example, a carbon hard mask, photoresist, dielectric material, bottom anti-reflective coating (BARC), nitride, or oxide. Sacrificial material 228 is deposited to a thickness sufficient to fill trench 234.

Sacrificial material 228 and protective hard mask layer 226 are then polished to be planar with the uppermost surface of dielectric material 212, as shown in FIG. 2G. In an embodiment, polishing is done by chemical mechanical polishing (CMP). In another embodiment, polishing is done by a plasma etch. In an embodiment, the remaining protective hard mask layer 226 and sacrificial material 228 in trench 234 form a self-aligned hard mask structure.

Next, dielectric material 212 is recessed to expose a portion of the sidewalls of fins 210, as shown in FIG. 2H. In an embodiment, the recessed dielectric material 212 forms shallow trench isolation (STI) regions 214. In an embodiment, the exposed portion of fins 210 will be used to form the active portions of the transistor. The amount of fin 210 exposed above STI region 214 will determine the drive current, gate width, and other transistor characteristics. As such, the extent to which dielectric material 212 is recessed is determined by the desired fin height $H_f$ above the surface of STI regions 214, as shown in FIG. 2H. The base of each fin 210 is isolated from neighboring fins by STI regions 214. STI regions 214 may also prevent leakage and cross-talk between neighboring fins. Dielectric material 212 may be recessed by any etching process selective to the materials forming protective hard mask 226 and sacrificial material 228.

In an embodiment, fins 210 have a high aspect ratio. The aspect ratio of fins 210 is defined as the ratio of fin 210 height $H_f$ above the STI region 214 to the fin width $W_f$, e.g. $H_f:W_f$. Fins 210 may have a height $H_f$ from 50-150 nm and a width $W_f$ from 5-15 nm. As such, fins 210 may have an aspect ratio from about 5:1-20:1.

In an embodiment, a gate dielectric material is blanket deposited over the fins to a uniform thickness. In an embodiment, the gate dielectric material forms a sacrificial gate dielectric over the surface of each fin 210. In another embodiment, the gate dielectric material forms a functional gate dielectric layer over the surface of each fin 210. Gate dielectric material may be any well known gate dielectric material. In an embodiment, gate dielectric material is silicon dioxide, silicon oxynitride, silicon nitride, or a high k material such as, for example, tantalum pentaoxide, titanium oxide, and hafnium oxide. Gate dielectric material may be formed from 5-20 Å thick.

Gate material 218 is then blanket deposited over the gate dielectric material, as shown in FIG. 1F. Gate material 218 conforms to the sidewall surfaces of the fins and the top surface of the hard mask structure comprising protective hard mask layer 226 and sacrificial material 228. Gate material 118 may be any well known material that may act as a functional gate or sacrificial gate, such as, for example, silicon dioxide, silicon nitride, polysilicon, or a metal.

Next, gate material 218 is etched to define a gate electrode, as shown in FIG. 2I. Gate material 218 is etched by any suitable process, such as a wet or dry etch. The exposed gate dielectric material is then etched from the surface of fins 210, in alignment with the gate electrode. In an embodiment, the gate dielectric layer and gate electrode define gate structure 220. In an embodiment, gate structure 220 wraps around the sidewalls and top surface of each fin 210. Gate structure 220 has a pair of sidewalls that run in a direction perpendicular to the length of fins 210. Gate structure 220 defines a channel region disposed in each fin 210 underneath the gate structure, and a source and drain region on opposite sides of the channel region.

Protective hard mask layer 226 and sacrificial material 228 protect the top surface of fin 210 during the etching processes defining gate structure 220. Due to the very tall height of fins 210, the gate structure etching process will remove the gate material 218 above fins 210 before removing gate material 218 above the surface of STI regions 214. In an embodiment, the gate dielectric material is removed from the surface of protective hard mask layer 226 and sacrificial material 228 by the gate electrode etch process. In an embodiment, a portion of protective hard mask layer 226 and sacrificial material 228 are removed by the gate etch process, preventing etching of the top surface of fins 210, so that the etch process may proceed to remove of gate material 218 from the surface of STI regions 214.

Next, a conformal spacer material is blanket deposited over gate structure 220, the self-aligned contact structure including protective hard mask layer 226 and sacrificial material 228, and fins 210. In an embodiment, the conformal spacer material is etched from horizontal surfaces to form gate sidewall spacers 222 and fin sidewall spacers 216, as shown in FIG. 2J. In an embodiment, a protection layer may be formed over the gate prior to the spacer etch so as to help protect the gate sidewall spacers during the spacer overetch to remove the spacer material from the fin. In an embodiment, gate sidewall spacers 222 protect the channel region during optional doping of the source and drain regions of the fin. In another embodiment, gate sidewall spacers 222 isolate the gate from epitaxial material subsequently grown from the surface of the source and drain regions of fins 210. In an embodiment of the invention, fin sidewall spacers 216 are removed from the sidewalls of fin 210 by the spacer etch process. The spacer material may be etched by any suitable process, such as dry ion anisotropic etching.

In an embodiment, the self-aligned contact structure consisting of protective hard mask layer 226 and sacrificial material 228 protect the top surface of fin 210 during the spacer etch process. In an embodiment, a portion of the self-aligned contact structure is removed by the spacer etch process.

Next, the self-aligned contact structure may be removed from the source and drain regions of fin 210 to expose the top surface of fin 210. Protective hard mask layer 226 and sacrificial material 228 may be removed, for example, by wet cleans. In an embodiment, protective hard mask layer 226 and sacrificial material 228 preserved the height of fin 210 during the prior steps of the fabrication process. In an embodiment, the exposed top surface of fin 210 is pristine due to the protection of protective hard mask 226 and sacrificial material 228 during the prior steps of the fabrication process. An epitaxial semiconductor layer may be grown from the top surface of fin 210. The pristine nature of the top surface of fin 210 facilitates growth of a high quality epitaxial semiconductor layer. The epitaxial semiconductor layer may also be grown from fin sidewalls.

In an embodiment of the invention, gate structure 220 is a functional gate electrode, forming a dual-gate device wherein each of the sidewalls of fins 210 form active regions of the transistor. In an embodiment, protective hard mask 226 and sacrificial material 228 isolate the top surface of fin 210 from gate structure 220, as shown in FIG. 2J.

In another embodiment, gate structure 220 is a sacrificial gate structure, wherein a functional gate structure will be formed by a replacement gate process, as shown in FIG. 2K. In such an embodiment, interlayer dielectric (ILD) material 234 is formed over the surface of the structure, as discussed above with respect to FIG. 1H. Next, gate structure 220 is removed to expose protective hard mask 226 and sacrificial material 228 on the top surface of fin 210 within the channel region. Sacrificial material 228 and protective hard mask 226 are then etched from the channel region to expose the top surface of fin 210. Gate dielectric 224 and gate electrode 230 may then be formed in the gate region as discussed above with respect to gate dielectric 124 and gate electrode 130 in FIG. 1H. In addition, protective hard mask layer 226 and sacrificial material 228 may be removed from the top surface of fins 210 in order to form source and drain contacts to the top surface of the fin.

Thus, a fin-based transistor having very tall fins may be formed, wherein the height of the fin is preserved during steps in the fabrication process by a self-aligned hard mask structure formed on the top surface of the fin.

Figure 3A:
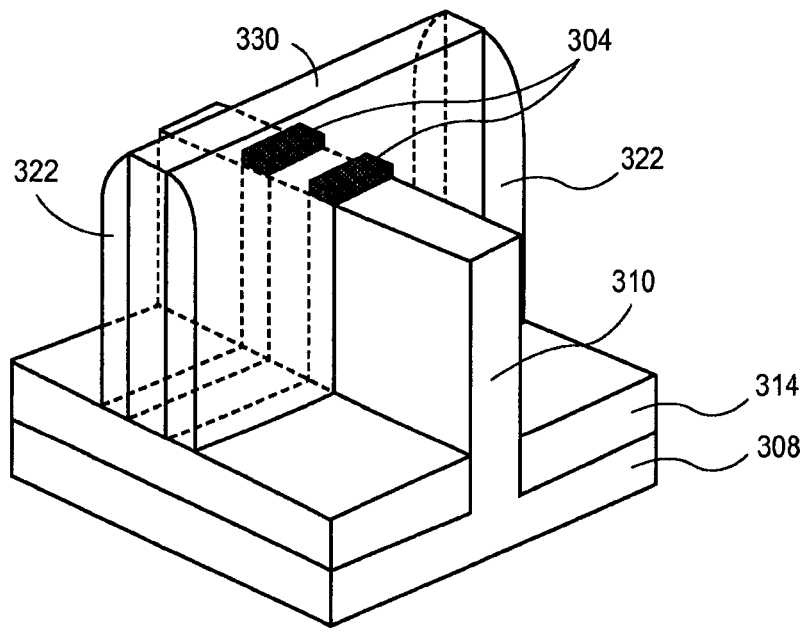
FIGS. 3A-B illustrate three-dimensional perspective views of fin-based semiconductor structures, in accordance with an embodiment of the invention.
Figure 3B:
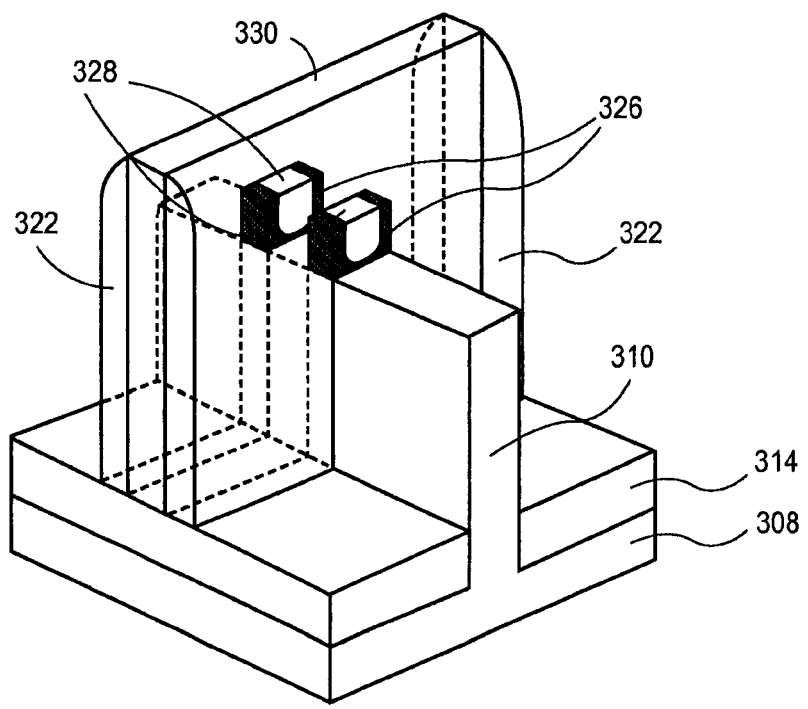

FIGS. 3A-3B illustrate two dimensional views of fin-based transistor structures comprising very tall fins. A substrate 308 has a tall fin 310 formed thereon. A base portion of fin 310 is surrounded by STI regions 314. A gate structure 330 wraps around the sidewalls and top surface of fin 310. Gate structure 330 has opposing sidewalls with gate sidewall spacers 322 formed thereon. In an embodiment, a first hard mask layer 304 covers the top surface of the fin, underneath each gate sidewall spacer 322. In an embodiment, first hard mask layer 304 contacts the sidewall of gate structure 330. In an embodiment, the composition of first hard mask layer 304 is the same as discussed above with respect to first hard mask layer 104.

FIG. 3B illustrates another embodiment of a transistor having very tall fins 310, where a hard mask structure is located between the top surface of fin 310 and each gate sidewall spacer 322, contacting the sidewall of gate structure 330. In an embodiment, the hard mask structure comprises a u-shaped hard mask layer 326, conforming to three sides of the hard mask structure defined by the top surface of fin 310 and sidewall spacer 322. In an embodiment, the composition of hard mask layer 326 is the same as discussed above with respect to protective hard mask layer 226. In an embodiment, sacrificial material 328 fills the u-shape defined by hard mask layer 326. In an embodiment, the composition of sacrificial material 328 is as discussed above with respect to sacrificial material 228.

Figure 4:
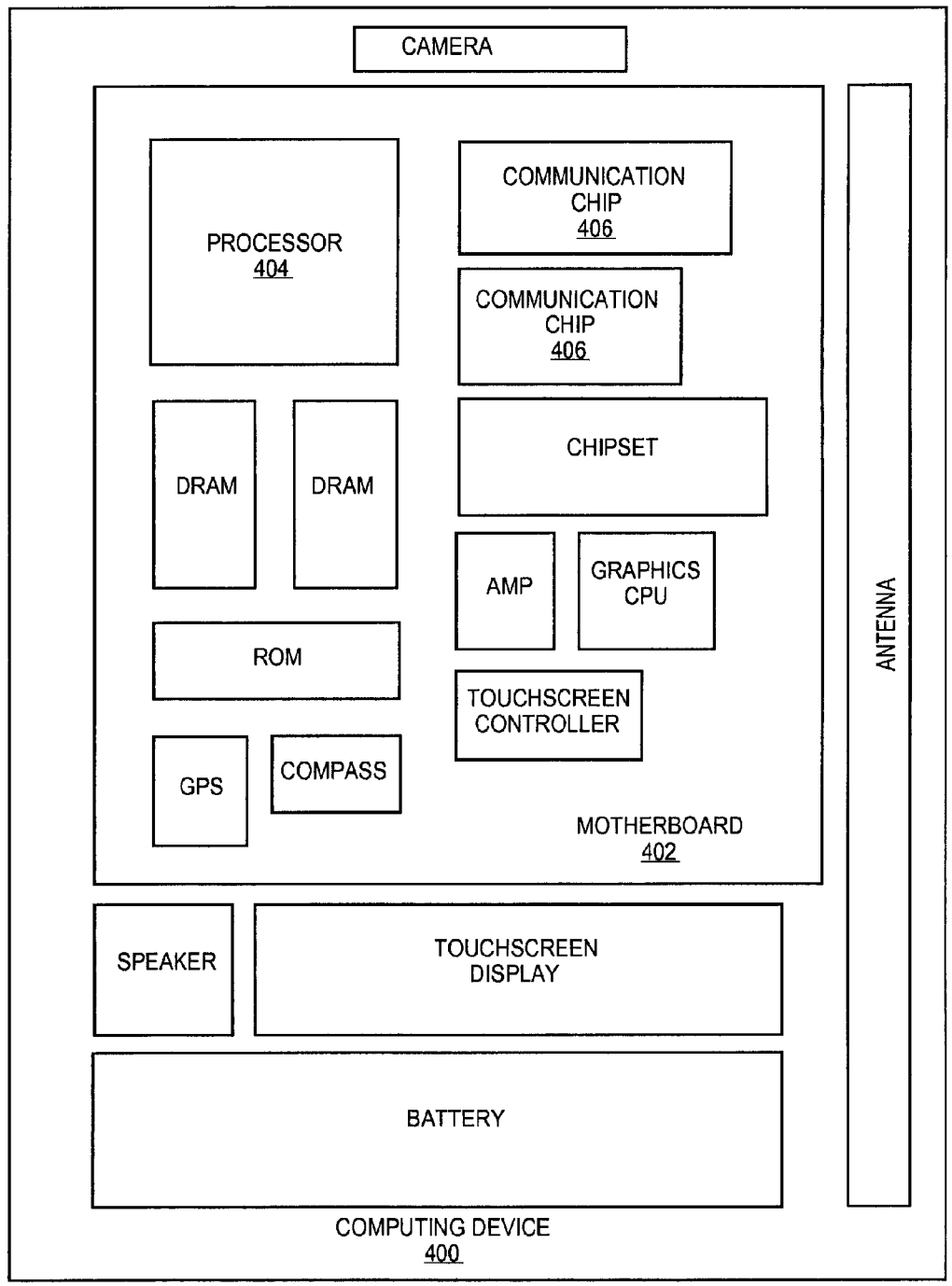
FIG. 4 illustrates a computing device in accordance with one embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more fin-based transistors having tall fins in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more fin-based transistors having tall fins in accordance with implementations of the invention.

In further implementations, another component housed within the computing device 400 may contain an integrated circuit die that includes one or more fin-based transistors having tall fins in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

What is claimed is:

1. A structure, comprising:
   a substrate having a fin, wherein the fin has a base portion and an active portion, and wherein the active portion has a top surface and first and second sidewall surfaces;
   isolation regions surrounding the base of the fin;
   a gate structure wrapping around the first sidewall surface, the top surface and the second sidewall surface of the fin, wherein the gate structure has gate sidewalls;
   sidewall spacers formed on the gate sidewalls and directly on the first and second sidewall surfaces of the fin; and
   a hard mask etch stop between the top surface of the fin and the sidewall spacers, wherein the hard mask etch stop is not between the gate structure and the top surface of the fin.

2. The structure of claim 1, wherein the hard mask etch stop comprises a hard mask material.

3. The structure of claim 2, wherein the hard mask material is selected from the group consisting of silicon dioxide, titanium oxide, hafnium oxide, aluminum oxide, and other dielectric films.

4. The structure of claim 1, wherein the hard mask etch stop comprises:
   a first hard mask layer; and
   a sacrificial fill material formed over the first hard mask layer.

5. The structure of claim 4, wherein the hard mask layer is selected from the grouping consisting of silicon dioxide, titanium oxide, hafnium oxide, aluminum oxide, and other dielectric films.

6. The structure of claim 4, wherein the sacrificial fill is selected from the group consisting of carbon hard mask, photoresist, dielectric material, bottom anti-reflective coating (BARC), nitride, or oxide.

7. The structure of claim 1, wherein the active portion of the fin has a fin height above the isolation regions, a fin width, and an aspect ratio, wherein the aspect ratio is the ratio of the fin height to the fin width.

8. The structure of claim 7, wherein the aspect ratio is greater than 10:1.

* * * * *